(12) United States Patent
Cook

(10) Patent No.: US 9,329,659 B2
(45) Date of Patent: May 3, 2016

(54) POWER MONITORING SYSTEM THAT DETERMINES FREQUENCY AND PHASE RELATIONSHIPS

(71) Applicant: Veris Industries, Inc., Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 282 days.

(21) Appl. No.: 14/156,222

(22) Filed: Jan. 15, 2014

(65) Prior Publication Data

US 2014/0223218 A1 Aug. 7, 2014

Related U.S. Application Data

(60) Provisional application No. 61/761,336, filed on Feb. 6, 2013.

(51) Int. Cl.
*G06F 1/26* (2006.01)
*G06F 1/32* (2006.01)
*G01R 21/133* (2006.01)

(52) U.S. Cl.
CPC ............ *G06F 1/3206* (2013.01); *G01R 21/133* (2013.01)

(58) Field of Classification Search
CPC ........ G06F 1/26; G06F 1/3206; G01R 21/133
USPC .............................. 713/300, 340, 320; 702/61
See application file for complete search history.

(56) References Cited

U.S. PATENT DOCUMENTS

| | | | |
|---|---|---|---|
| 4,709,339 A | 11/1987 | Fernandes | |
| 5,880,677 A | 3/1999 | Lestician | |
| 5,995,911 A | 11/1999 | Hart | |
| 6,064,192 A | 5/2000 | Redmyer | |
| 6,330,516 B1 | 12/2001 | Kammeter | |
| 6,373,238 B2 | 4/2002 | Lewis et al. | |
| 6,737,854 B2 | 5/2004 | Bruno et al. | |
| 6,809,509 B2 | 10/2004 | Bruno et al. | |
| 6,937,003 B2* | 8/2005 | Bowman | G01R 15/14 324/117 R |
| 7,330,022 B2 | 2/2008 | Bowman et al. | |
| 7,474,088 B2 | 1/2009 | Bowman et al. | |
| 7,511,229 B2 | 3/2009 | Vlasak et al. | |
| 7,526,393 B2 | 4/2009 | Thurmond et al. | |
| 7,538,540 B2 | 5/2009 | Tsukamoto | |
| 7,865,320 B2* | 1/2011 | Long | G01R 21/133 702/61 |
| 8,294,453 B2 | 10/2012 | Bowman | |
| 8,405,383 B2 | 3/2013 | Agrawal et al. | |
| 8,493,060 B1 | 7/2013 | Mahoney | |
| 8,624,578 B2 | 1/2014 | Rupert et al. | |
| 8,624,583 B2 | 1/2014 | Clegg | |
| 8,892,931 B2* | 11/2014 | Kruglick | G06F 1/3243 713/340 |
| 2008/0158008 A1 | 7/2008 | Kagan et al. | |
| 2010/0295540 A1 | 11/2010 | Bowman | |
| 2010/0308792 A1 | 12/2010 | Rupert et al. | |
| 2010/0308800 A1 | 12/2010 | Clegg | |
| 2011/0181438 A1 | 7/2011 | Millstein et al. | |
| 2012/0072143 A1* | 3/2012 | Yogeeswaran | G01R 15/207 702/61 |
| 2012/0200285 A1* | 8/2012 | Carpenter | G01R 21/133 324/157 |
| 2012/0235667 A1 | 9/2012 | Agrawal et al. | |
| 2013/0271895 A1 | 10/2013 | Kuhns | |

* cited by examiner

*Primary Examiner* — Chun Cao
(74) *Attorney, Agent, or Firm* — Chernoff Vilhauer McClung & Stenzel, LLP

(57) ABSTRACT

A power monitoring system includes a plurality of current sensors suitable to sense respective changing electrical current within a respective conductor to a respective load and a conductor sensing a respective voltage potential provided to the respective load.

20 Claims, 14 Drawing Sheets

POWER MONITORING SYSTEM THAT DETERMINES FREQUENCY AND PHASE RELATIONSHIPS

CROSS-REFERENCE TO RELATED APPLICATIONS

This application claims the benefit of U.S. Provisional App. No. 61/761,336, filed Feb. 6, 2013.

BACKGROUND OF THE INVENTION

The present invention relates generally to a power meter with effective measurements.

Electrical power is provided to many devices, such as large motors, by three separate cables, each of which supplies a single phase of three phase-power. In an ideal system, each of the phases within the respective cable has a phase angle which is generally 120 degrees apart from the other phases. Accordingly, the total power flowing through the three cables to a three-phase load (or from a three-phase generator) may be computed based upon the phase adjusted voltages and the phase adjusted currents.

A sub-metering system generally includes a separate transformer installed on each respective cable of the three cables of a three-phase system within a customer's power box containing the electrical panel. Each transformer senses a changing current within a respective cable and produces an output voltage or current proportional to the changing current. A measuring circuit is electrically connected to the three transformers and receives each of the transformer output voltages or currents. The measuring circuit is also electrically connected to the three cables by voltage "taps" to measure the voltage therein. The voltage "tap" measurements are preferably obtained by an electrical connection to the interface between each phase of the respective cable and the panel. The measuring circuit calculates the power usage of the respective three phases using the output voltages from the transformers and the voltages sensed by the three voltage "taps."

Flexibility has favored adoption of digital current and power meters, known as branch circuit monitors, incorporating data processing systems typically comprising one or more microprocessors or digital signal processors (DSP) that periodically read the output of each of the voltage and current transducers, calculate the current or voltage at the respective transducer and display or store the results. In addition, the data processing unit periodically may calculate the power and other electrical parameters, such as active power, apparent power and reactive power that quantify electricity distribution and consumption. The calculated parameters are typically output to a display for immediate viewing and/or transmitted from a communications interface to another data processing system, such as a building management computer for remote display or further processing, for example formulating instructions to automated building equipment. Unfortunately, with increasingly more complicated power measurement systems, the processors are not suitable to receive a sufficient number of independent measurements through the limited number of pins available on the microprocessor chip.

What is desired therefore is a power meter with effective measurements.

The foregoing and other objectives, features, and advantages of the invention may be more readily understood upon consideration of the following detailed description of the invention, taken in conjunction with the accompanying drawings.

DETAILED DESCRIPTION OF PREFERRED EMBODIMENT

Figure 1:
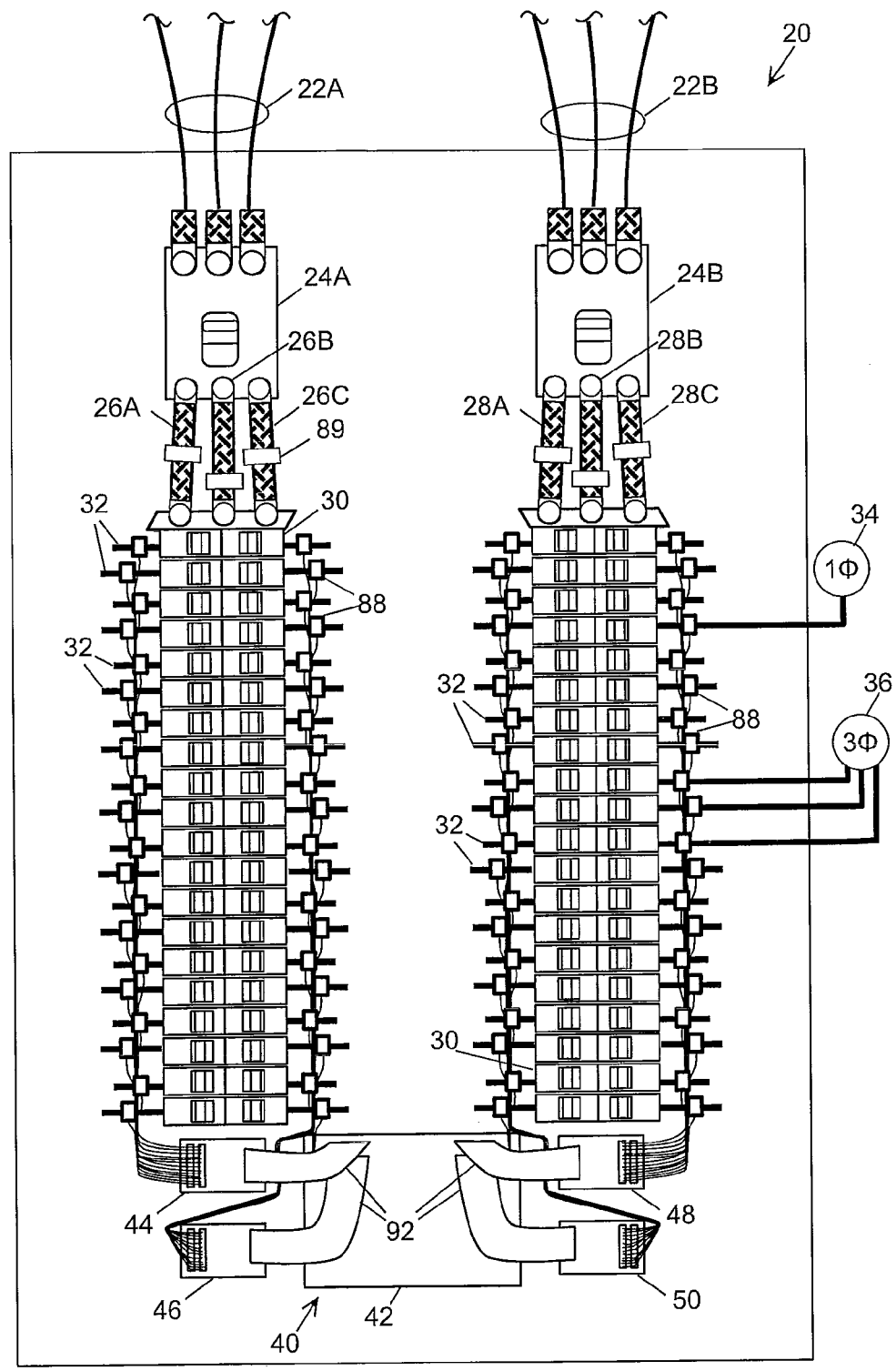
FIG. 1 illustrates an exemplary power meter system.

Electricity delivered by the local utility to a facility's mains is distributed to the various loads in the facility by branch circuits which are conductively connected to the mains at a distribution panel. Referring in detail to the drawings where similar parts are identified by like reference numerals, and, more particularly to FIG. 1, an exemplary distribution panel 20 includes two three-phase mains 22A, 22B which are respectively connected to main circuit breakers 24A, 24B. Each of the phases of each main is connected to a respective bus bar 26A, 26B, 26C and 28A, 28B, 28C. Three of the bus bars extend behind each of two rows of branch circuit breakers 30 that respectively conductively connect one of the bus bars to a branch circuit conductor 32 which is conductively connected to the load(s) of the branch circuit. A single phase load, for example, load 34, is conductively connected to a single bus bar. A two-phase load is connected, typically through two adjacent circuit breakers in the same row, to two bus bars conducting different phases of the power. A three-phase load, for example, load 36, is connected, typically through three adjacent circuit breakers in the same row, to three bus bars each conducting a different phase of the electricity.

A digital branch circuit monitor 40 is often installed in an electrical distribution panel, such as the exemplary distribution panel 20, to monitor the current or the current and the voltage in the circuits served by the panel. For example, a digital branch circuit monitor produced by Veris Industries, Inc. can monitor the current or the power (current and voltage) in up to 84 branch circuits and two three-phase mains of a power distribution panel and can determine, in addition to voltage and current, a number of other parameters related to energy consumption for each circuit served by the distribution panel. Data updates occur approximately every two seconds and an alarm may be triggered by the monitor if the operation of a circuit approaches a user configured threshold. The exemplary branch circuit monitor 40 comprises a main acquisition board 42 and four adapter boards 44, 46, 48, 50 facilitating interconnection of the measuring circuitry and the transducers which sense current and voltage in the various conductors of the distribution panel.

Figure 2:
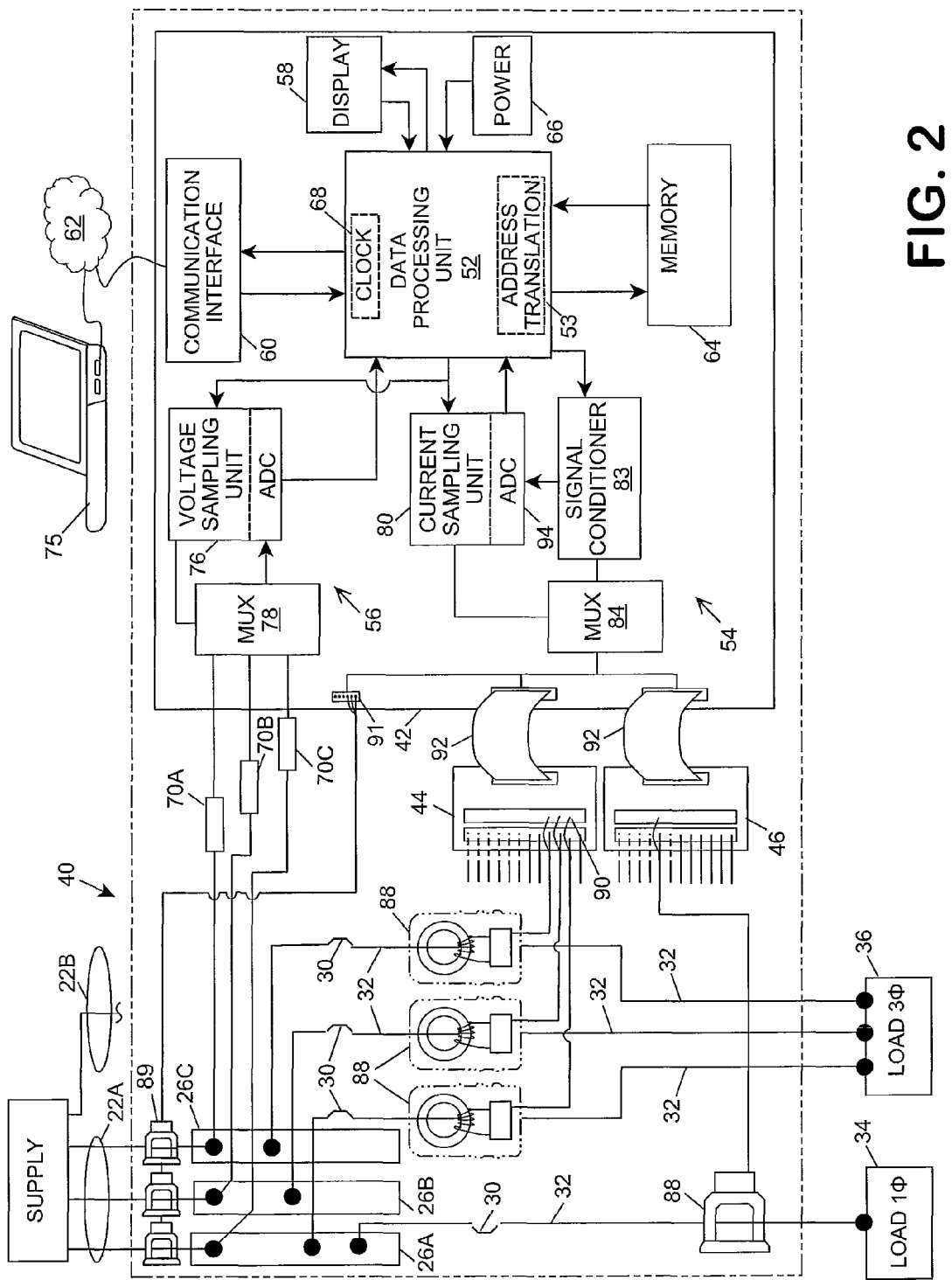
FIG. 2 illustrates an exemplary power meter board.

Referring also to FIG. 2, the exemplary digital branch circuit monitor 40 is arranged to monitor the both voltage and current in a plurality of branch circuits and comprises, generally, a data processing unit 52, a current measuring section 54 and a voltage measuring section 56. The data processing unit 52 typically comprises at least one microprocessor or digital signal processor (DSP). The data processing unit 52 periodically reads and stores data from the voltage 56 and the current 54 measuring sections, and uses that data to calculate the current, voltage, power and other electrical parameters that are the meter's output. The calculated values may be output to a display 58 for viewing at the meter or output to a communications interface 60 for transmission via a communication network 62 to another data processing system 75, such as a building management computer, for remote display or use in automating or managing the facility's operations. A memory 64 in which the software for the data processing unit and data manipulated by the data processing unit may be stored is associated with the data processing unit. A power supply 66 provides power to the data processing unit and to the voltage and current measuring sections. One or more clocks 68, which may be incorporated into the data processing unit, time intervals between the occurrences of monitored events.

The voltage measuring section 56 includes one or more voltage transducers 70A, 70B, 70C each typically comprising a resistor network, a voltage sampling unit 76 to sample the output of the voltage transducers and convert the analog measurements to digital data suitable for use by the data processing unit and a multiplexer 78 that periodically connects the voltage sampling unit to a selected one of the voltage transducers enabling periodic sampling of the magnitude of the voltage at each voltage transducer. Typically, each phase of the electricity supplied to a distribution panel is connected to a bus bar, for example, bus bars 26A, 26B, 26C, and each branch circuit breaker 30 connectively interconnects one of the bus bars to a branch circuit conductor 32. One or more of the branch circuit conductors are conductively connected to each of the facility's loads, for examples, loads 34, 36. Since the voltage and phase supplied to all commonly connected loads is the same, a meter for measuring three-phase power typically includes at least three voltage transducers 70A, 70B, 70C each connected to one of the bus bars 26A, 26B, 26C that is conducting a different phase of the power from one of the mains, for example, main 22A.

The current measuring section 54 comprises a current sampling unit 80, a multiplexer 84, a signal conditioning unit 83 and a plurality of current transducers each representing data channel in the branch circuit monitor. The current transducers are preferably current transformers but other types of current sensors might be used. Current monitoring with a current transformer uses a current transformer for each of the conductors in which the current is to be monitored. In the exemplary branch circuit monitor 40 a current transformer 89 senses the current in each of the panel's mains and a branch current transducer 88 senses the current in each of the panel's branch circuit conductors 32.

The auxiliary current transformers 89 monitoring the current in the mains are connected to a terminal block 91 on the main circuit board. Each terminal of the terminal block 91 is conductively connected to the multiplexer 84. For convenience, each of the branch current transducers 88 may be respectively connected to a sensor position 90 on one of the adapter boards, 44, 46, 48, 50. A multi-conductor cable 92 communicatively connects each of the sensor positions of each of the adapter boards to the multiplexer 84 on the main circuit board 42. The multiplexer 84 is connected to a signal conditioning unit 83 which is, in turn, conductively connected to an analog-to-digital converter 94 of the current sampling unit 80. In response to a timing signal from the clock 68, the multiplexer sequentially connects each sensor position and each terminal block connection to the signal conditioning unit and, thereby, the analog-to-digital converter which outputs to the data processing unit 52 a digital signal representing a sample output of the respective current transducer.

Instantaneous values of the sinusoidal analog voltage and current waveforms are digitally captured by periodically, sampling the amplitudes of the outputs of respective voltage and current transducers. The data processing unit calculates the current in the power cable monitored by a current transducer from the characteristics of the transducer and a plurality of sample outputs of the transducer accumulated over a period of time. The "effective," "real" or "active" power is approximated by averaging the sum of the products of temporally corresponding instantaneous samples of the voltage and current for each of the plurality of sampling intervals, such as, at least one cycle of the sinusoidal waveform. Often, the frequency of the signals is likewise determined in some manner.

The power monitoring system described above may have a multitude of different configurations of the voltages and phases associated with the loads. For example, the power monitoring system may include three different current transformers to sense the current provided to a three phase load, include two different current transformers to sense the current provided to a two phase load, and include one current transformer to sense the current provided to a single phase load. Unfortunately, the two phase current transformers and three phase current transformers are often connected with one or more of the phases reversed. In addition, the phase offset between the different phases tends to vary to some degree based on the particular load. Furthermore, with an increasingly large number of current transformers and/or voltage sensors together with sensing of the frequency of the signals, the resulting number of connections to the microprocessor tends to significantly increase. This limitation in the number of connections to the microprocessor can be alleviated to some extent with the use of multiplexers, but this unfortunately results in a decrease in the availability of the signals because of the need to temporally multiplex multiple signals to a single pin of the microprocessor. This decrease in signal availability tends to decrease the accuracy of the power system.

In some applications, the power monitoring system is modified to measure the power for a more limited circuit configuration. In such a case, the power monitoring system may include up to three different current transformers to (1) sense the current provided to one load (e.g., a three phase load), (2) to sense the current provided to two loads (e.g., two single phase loads or, a combination of a two phase load and a single phase load), (3) and/or to sense the current provided to three loads (e.g., three single phase loads). In such cases, up to three different voltage sensors sense the voltage provided to the one or more loads, together with the sensing of the frequency of the current (or voltage) signals, would likewise be included with the power monitoring system. While the power meter may be somewhat simplified, a number of different potential configurations still exist together with the likelihood that respective phases of a multi-phase load will not be properly identified. This decrease in signal availability tends to decrease the accuracy of the power system.

The present inventor considered the limitations presented by the number of potentially different configurations, the difficulty in determining the number of phases of a circuit and/or the phase orientations, together with the limited availability of input pins (e.g., connections) to the microprocessor for the signals. Moreover, it is desirable that many of the signals are simultaneously available for sensing by the microprocessor. A modified power monitoring system is desirable to alleviate one or more of these limitations.

During normal installation the sensors, e.g., current transformers, are initially affixed within the power panel in an adjacent spaced apart relationship with respect to a set of circuit breakers. A support may be located on both sides of the set of circuit breakers that support the sensors, if desired. Then, the wires from the loads are passed through the respective sensors and interconnected to a respective circuit breaker. In addition, the wires for sensing the voltage potentials on the bus bars are likewise electrically interconnected. In this manner, the installation of the circuit breakers and the power monitor is efficient, less expensive, economical, and the sensors are in a suitable position with respect to the respective circuit breakers The support may be suitable for supporting a set of electrical traces that interconnect the sensors to a connector. The interconnection from the sensors to the connector may be predetermined so that the signals provided to the connector are readily identifiable to the proper sensor. This eliminates the potential possibility of improperly interconnecting the wires from the sensors to the connector. A cable interconnects each connector to a power monitor. While such a set of supports with respective sensors are suitable for use with new installation, it is difficult to install such a set of sensors to an existing set of circuit breakers with wires already installed. To permit the sensors to be readily interconnected with wires already interconnected to the circuit breakers the sensors may be constructed in a split-core manner. In this manner, the opening may be opened, the wire inserted therein, and the opening closed around substantially all of the wire. In some cases, the current sensors may be interconnected to the power monitor each with a respective flexible wire with or without split core sensors which tends to result in more installation issues.

Traditionally, the electrical installer is required to identify the phase of the bus bars of the power panel, such as phase A, phase B, and phase C to properly interconnect the wires of phase A, phase B, and phase C, to the appropriate bus bar and connection on the power monitor. In addition, the electrical installer is required to identify the phase, such as phase A, phase B, and phase C, of each circuit breaker, or phase a multi-phase circuit breaker. With each circuit breaker's phase identified, then the electrical installer is required to properly interconnect each respective current sensor to the appropriate interconnection on the power monitor.

The proper installation of a power monitoring system is problematic because the phase of each of the bus bars are normally not identified in a consistent manner, especially when the phase of each bus bar depends upon its interconnection to the power service from the utility. Similarly, the phase of each of the circuit breakers of a multi-phase circuit breaker are not necessarily identified in a consistent manner. Further, the phase of each single phase circuit breaker depends upon its interconnection to one or more of the bus bars, which may be difficult to identify because the interconnection is typically underneath an installed circuit breaker. To further complicate matters, the phase of the current within each of the current sensors depends upon which wire the current sensor is associated with. Also, it may be difficult to identify two phase circuits. Also, single phase circuits may be improperly included as part of a multi-phase circuit. Accordingly, the electrical installer needs to determine the phase of the bus bar, determine the phase of the associated circuit breaker, identify the wire interconnected with the circuit breaker, associate a particular current sensor with the interconnected wire, and interconnect the current sensor to the appropriate location of the power monitor. The likelihood of an electrical installer properly identifying all of these relationships is unlikely, especially the phase relationships between different phases for a particular multi-phase load. In addition, the power meter should determine the frequency of the current and/or voltages.

To verify or otherwise determine which phases from the current sensors are associated with which voltage from the bus bars, may involve the power meter assuming a unity power factor and matching those with the closest phase relationship. This may be performed in an automated manner so that the single phase, two phase, and/or three phase circuits may be identified and the phase relationship between the phases, if desired. For example, the rising edge of the waveforms may be used to identify a consistent point in each cycle of the signal for each phase of the zero crossings. The identified cycles are then matched together to determine the likely arrangement of single, two, and three phase circuits and the relationship of phases therein, if desired.

In any event, the configuration of the system may be automatically determined. If desired, the installer may review and modify the resulting auto determined configuration of single, two, and/or three phase circuits, and the phase relationships, if desired.

By way of example, if the power meter determines that two adjacent circuits are 180 degrees out of phase then the power meter may assign these two phases to be part of a 2-phase system. The two phase system may be a residential split phase system, having 3 wire single phase distribution with two live conductors (i.e. 3 wire, single phase, midpoint neutral system). By way of example, if the power meter determines that two or more adjacent circuits are the same phase then the power meter may assign these two or more adjacent circuits as each of a single phase system. Also, circuits that are not otherwise assigned to multi-phase circuits may be assigned as each being part of a single phase system. By way of example, if the power meter determines that three adjacent circuits are generally 120 degrees out of phase then the power system may assign these three as part of a 3 phase system The system may also determine the order of the phases A, B, and C among the three phases. In addition, the system may determine and assign two and three phase circuits to non-adjacent circuits. The same general technique may likewise be applied to a plurality of current sensors where the voltages are not obtained or otherwise not used to determine the power. It is to be understood that any suitable characteristic may be used to characterize the sensed signals, such as rising edge, falling edge, maximum, minimum, and/or zero crossing.

Figure 3:
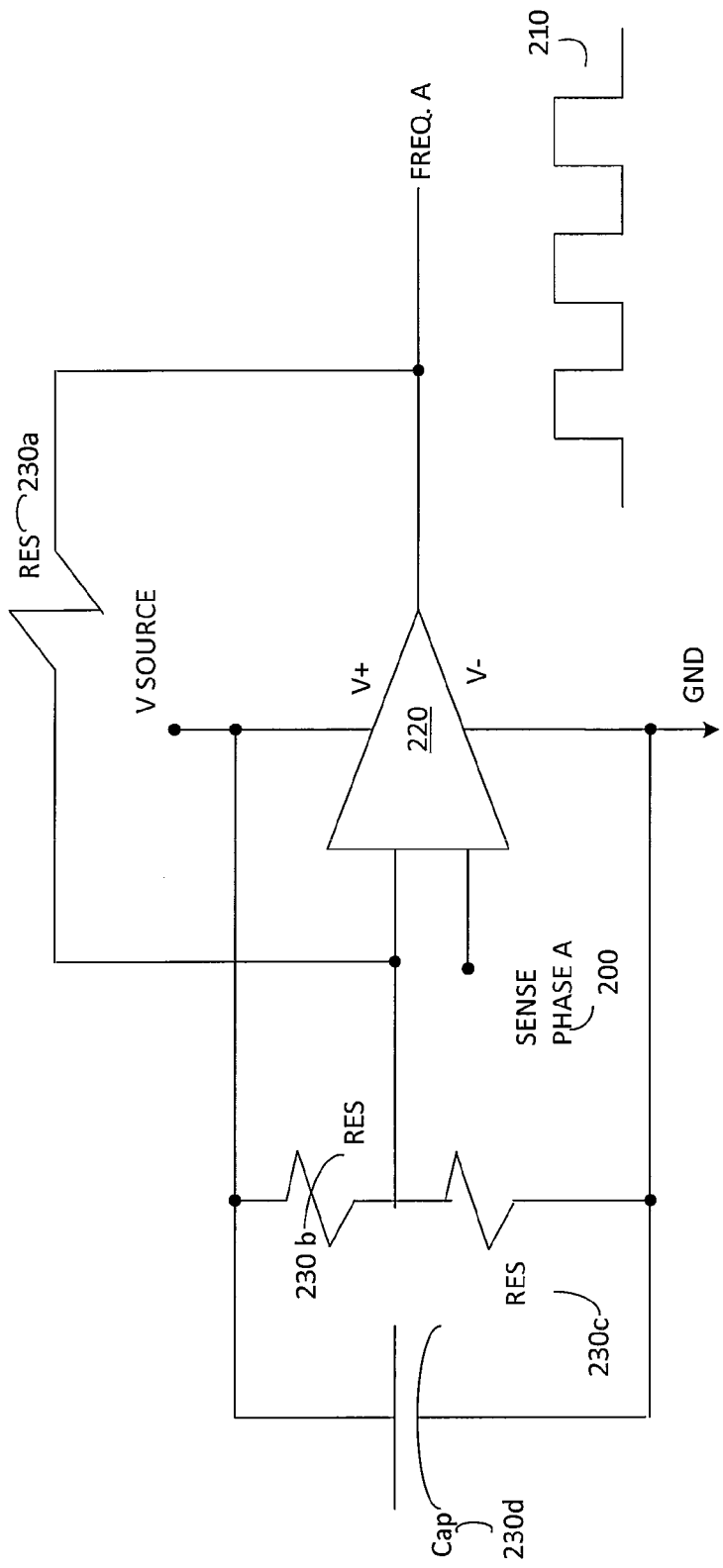
FIG. 3 illustrates a phase A rectification circuit.

Referring to FIG. 3, to determine the frequency of the signal for a phase of the power distribution system, a sense phase A 200 may be interconnected to phase A (or whatever phase is considered to be phase A) of the power distribution system, such as the voltage and/or the current. The sense phase A 200 signal may be processed to provide a series of rectangular pulses 210 corresponding to the input signal, such as the zero crossings of a sinusoidal signal. The series of rectangular pulses may be provided by using an operational amplifier 220 together with a set of capacitors and resistors 230*a*, 230*b*, 230*c*, and 230*d*. Other circuits may likewise be used. A rectangular pulse is particularly useful for a microprocessor to trigger an interrupt in the microprocessor.

Figure 4:
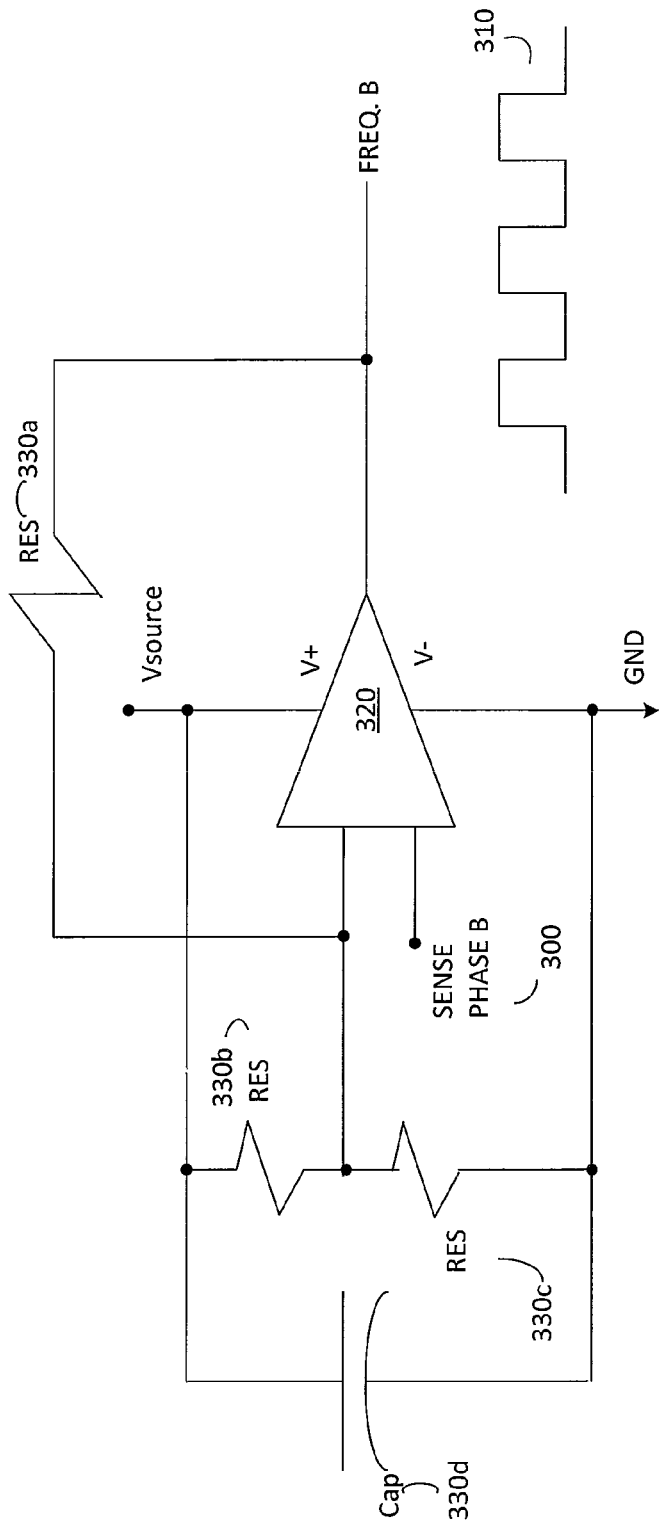
FIG. 4 illustrates a phase B rectification circuit.

Referring to FIG. 4, to determine the frequency of the signal a sense phase B 300 may be interconnected to phase B (or whatever phase is considered to be phase B) of the power distribution system, such as the voltage and/or the current. The sense phase A 300 signal may be processed to provide a series of rectangular pulses 310 corresponding to the input signal, such as the zero crossings of a sinusoidal signal. The series of rectangular pulses may be provided by using an operational amplifier 320 together with a set of capacitors and resistors 330a, 330b, 330c, and 330d. Other circuits may likewise be used. Additional such circuits may be used for other circuits of different loads, as desired.

Figure 5:
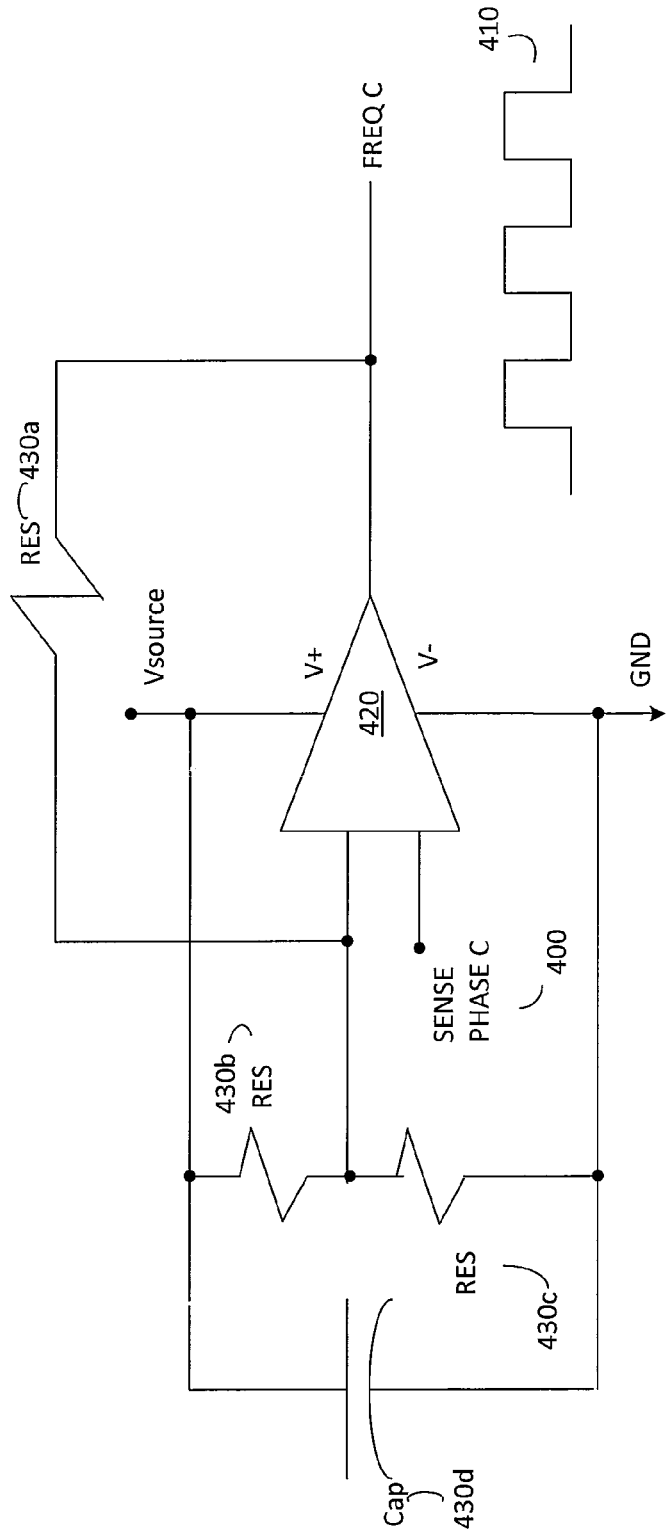
FIG. 5 illustrates a phase C rectification circuit.

Referring to FIG. 5, to determine the frequency of the signal a sense phase C 400 may be interconnected to phase B (or whatever phase is considered to be phase B) of the power distribution system, such as the voltage and/or the current. The sense phase A 400 signal may be processed to provide a series of rectangular pulses 410 corresponding to the input signal, such as the zero crossings of a sinusoidal signal. The series of rectangular pulses may be determined by using an operational amplifier 420 together with a set of capacitors and resistors 430a, 430b, 430c, and 430d. Other circuits may likewise be used.

Figure 6:
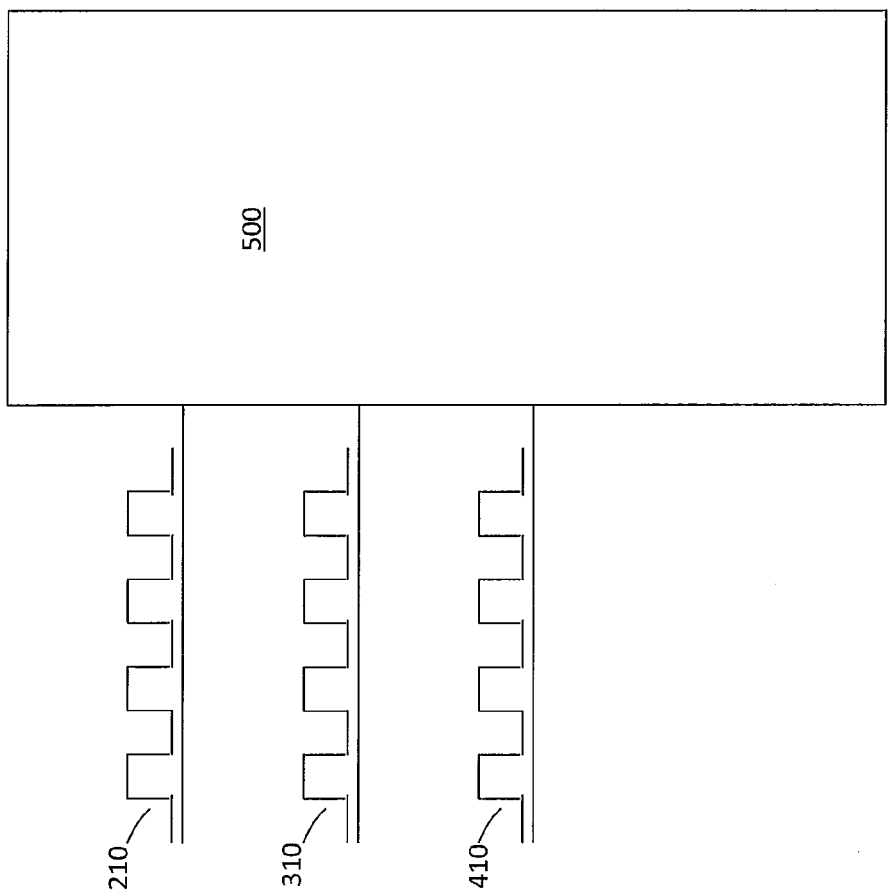
FIG. 6 illustrates multiple signals to multiple pins of a microcontroller.

Referring to FIG. 6, each of the rectangular signals 210, 310, and 410 may be provided to a microprocessor 500 (e.g., microcontroller, logic gates, FPGA, ASIC, etc.) for the power system to determine the frequency of the respective signals. In this configuration, each of the signals is continually available to the microprocessor for processing and thus avoiding the need to multiplex the signals to the microprocessor 500, and the limitations associated therewith. However, it is often desirable that multiple signals are available to the microprocessor though the use of a single pin (e.g., input/output).

Figure 7:
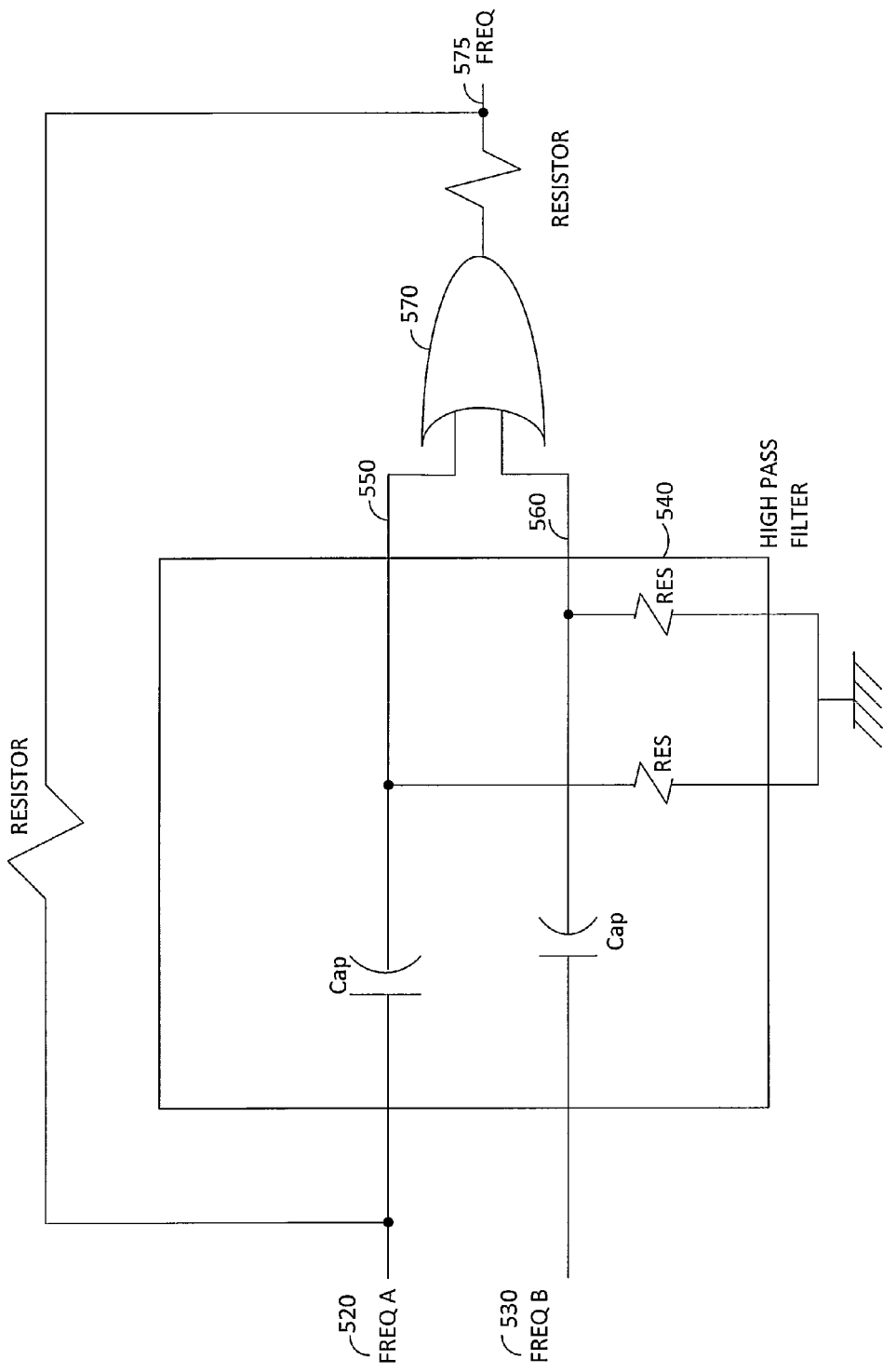
FIG. 7 illustrates a high pass filter with a logical operator.

Referring to FIG. 7, a frequency input for phase A 520 is preferably sensed from phase A of the corresponding current transformer, or alternatively phase A of the voltage source. A frequency input for phase B 530 is preferably sensed from phase B of the corresponding current transformer, or alternatively phase B of the voltage source. A high pass filter 540 may filter each of the frequency inputs 520, 530 so that the corresponding outputs 550, 560 are more binary and otherwise more in the form of a logical binary signal. The outputs 550, 560 are provided to an OR gate 570. The output 575 of the OR gate 570 is an "OR" operation. Accordingly, if the frequency A is "high" (e.g., above the zero crossing) then the output of the "OR" operation is "high". If the frequency B is "high" (e.g., above the zero crossing) then the output of the "OR" operation is "high". The output of the OR gate 570 is only low in the event that both the frequency A is "low" (e.g., below the zero crossing) and the frequency B is "low" (e.g., below the zero crossing). In this manner, the output of the OR gate 570, in general, indicates when one of the outputs are the same (e.g., above the zero crossing) or when both of the outputs are the same (e.g., below the zero crossing). Other logical operations may likewise be performed to provide a signal composed of at least a pair of signals.

Figure 8:
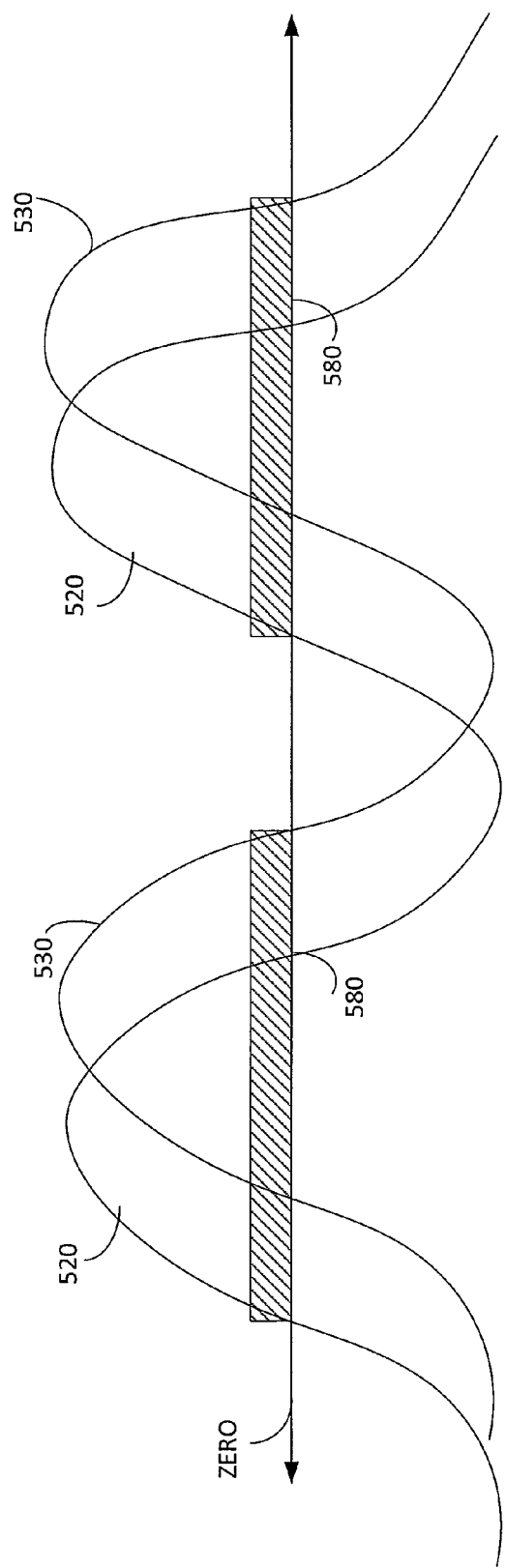
FIG. 8 illustrates a pair of overlapping signals.

Referring to FIG. 8, for a pair of sinusoidal inputs 520, 530 for phase A and B, respectively, illustrate exemplary relative sensed waveforms. Based upon a zero crossing detector, the time period that either input 520 is above zero or the time period that input 530 is above zero is periodic time periods 580. It may be observed that the time periods 580 form a consistent repeating pattern if both of the sinusoidal inputs 520, 530 have the same frequency which is often the case.

Figure 9:
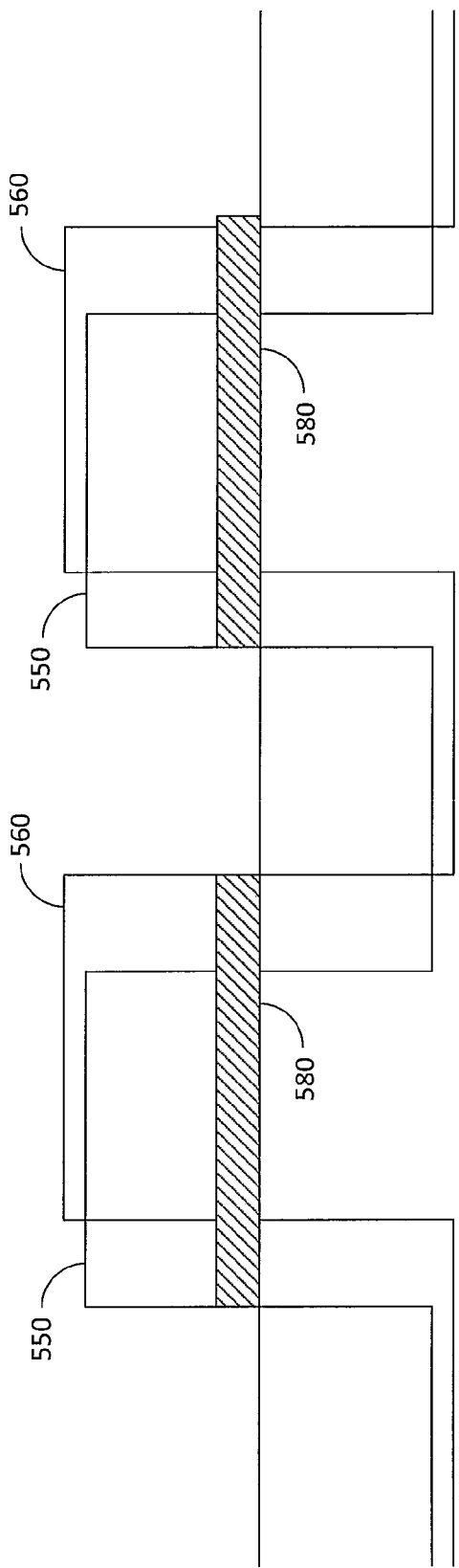
FIG. 9 illustrates a pair of rectified overlapping signals.

Referring to FIG. 9, a pair of rectangular outputs 550, 560 corresponding to the sinusoidal inputs 520, 530 of FIG. 8 are illustrated. The periodic time periods 580 are also illustrated.

Figure 10:
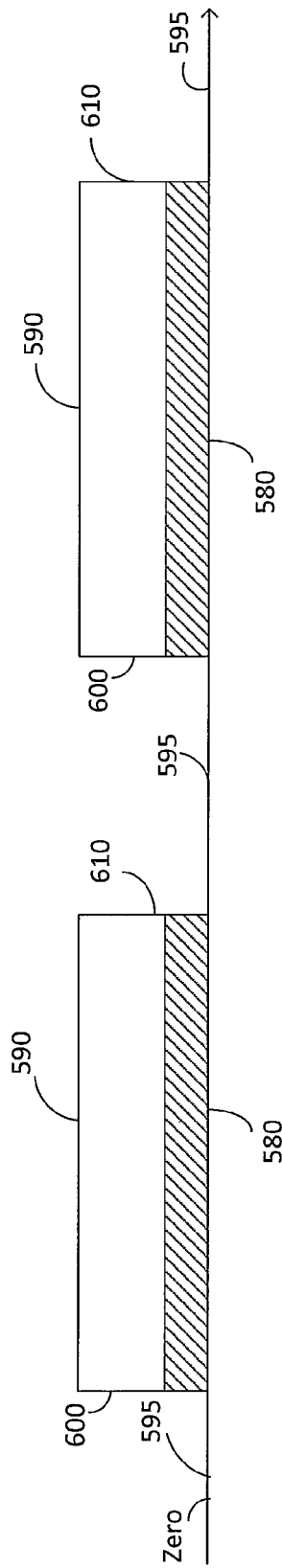
FIG. 10 illustrates a logical set of outputs of a pair of signals.
Figure 11:
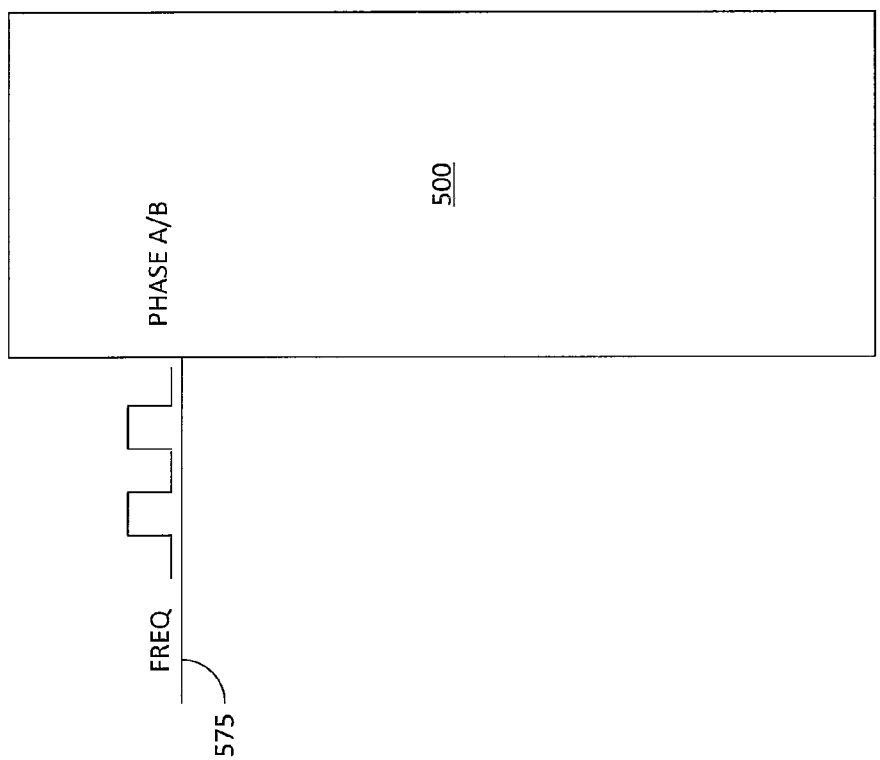
FIG. 11 illustrates multiple signals to a single pin of a microprocessor.

Referring to FIG. 10, the output 575 of the OR operation 570 provides a logic 1 level 590 during the periodic time period 580 and a logic 0 level 595 during the time other than the periodic time period 580. As it may be illustrated, with further reference to FIG. 9, the time period between rising edges 600 indicate the frequency of the corresponding phase A 520. As it may be illustrated, the time period between falling edges 610 indicate the frequency of the corresponding phase B 530. Also, a comparison of the relative timing of the rising edge(s) 600 and the falling edge(s) 610 together with the duration of the periodic time period 580 and the duration of the non-periodic time period, the phase offset between phase A 520 and phase B 530 may be determined. Referring also to FIG. 11, these determinations may be made where both signals 575 (see FIG. 7) are being provided to the microprocessor at the same time without the need for multiplexing the signals. Furthermore, this configuration likewise permits the use of fewer pins of the microprocessor. This technique may likewise be extended to three phase circuits, if desired. This technique may likewise be extended to the characterization of two pairs of phases of a three phase circuit to determine the relationships between the three phases, such as the order of phases A, B, and C. This technique may likewise be used to determine if a circuit is a two phase circuit, such as phases A and B, by the pair of circuits being generally 180 degrees out of phase. It is also to be understood that other filters (if any) and logical operations (if any) may likewise be used, such as an AND operation, a NOR operation, a NAND operation, and/or an XOR operation. As it may be observed, based upon the combined data, the phase relationship may be determined. As it may be observed, based upon the combined data, the frequency of one or more of the phases may be determined. As it may be observed, based upon the combined data, the phase relationship and the frequency of one or more of the phases, may be determined.

Figure 12:
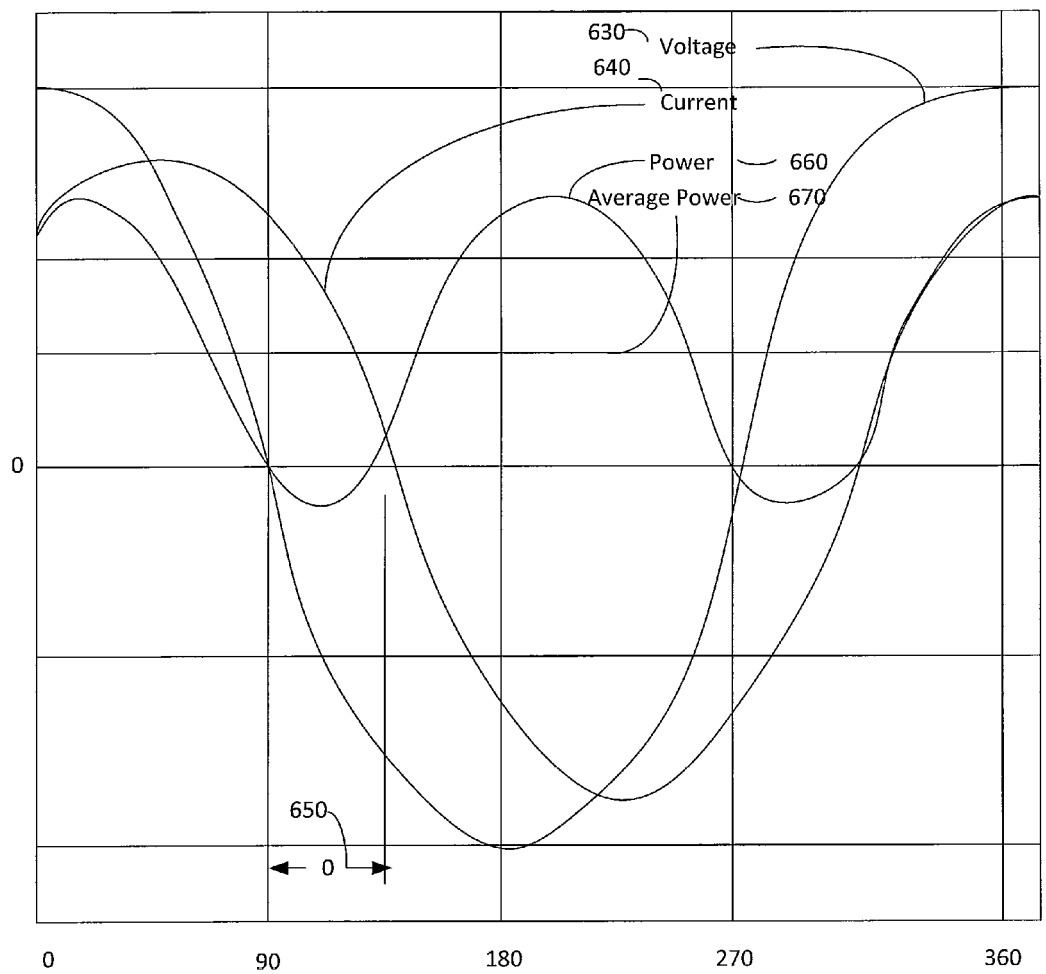
FIG. 12 illustrates a power determination.

Referring to FIG. 12, an exemplary set of waveforms is illustrated. A voltage waveform 630 is illustrated together with its corresponding current waveform 640 and a power factor 650. A waveform of instantaneous power 660 is determined based upon the voltage waveform 630, the current waveform 640, and the power factor 650. An average power 670 may also be determined. In some situations it is desirable to calculate other factors for a single phase or multi-phase circuit, such as a distortion factor which may be based upon root-mean-square calculations, such as harmonics, such as the effects of clipping, and other characterizations. To effectively calculate the power the current signals should be scaled to a suitable range for input to the microprocessor. Furthermore, the gain required for the signals to be scaled to a suitable range for the microprocessor tend to vary over time, and should be available without the need to perform a switching operation which results in a settling time before the signals are once again sufficiently stable.

Figure 13:
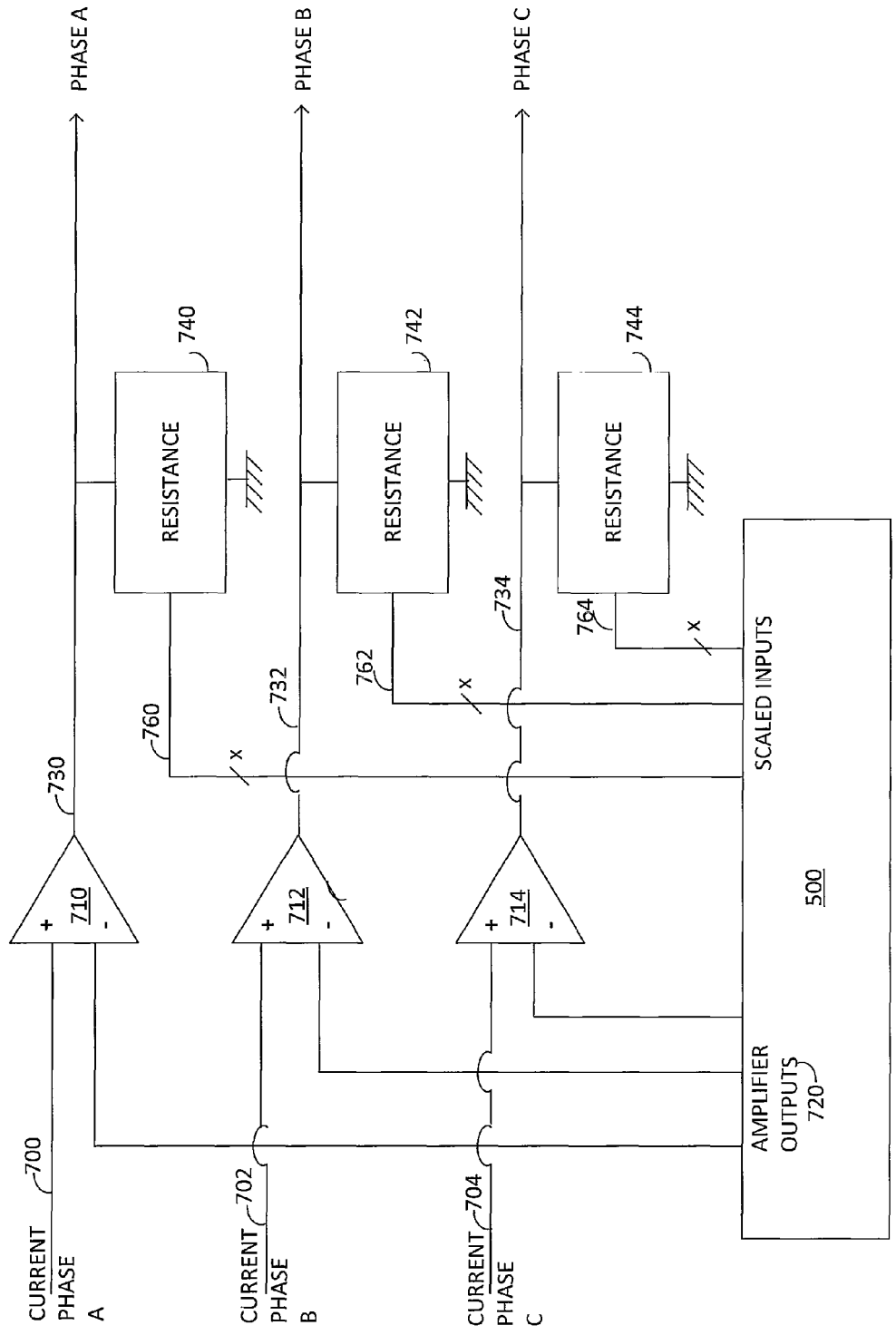
FIG. 13 illustrates a multi-current selection circuit.

Referring to FIG. 13, the current for phase A 700 (e.g., the sinusoidal input), may be provided to an input of an operational amplifier 710. The current for phase B 702 (e.g., the sinusoidal input), may be provided to an input of an operational amplifier 712. The current for phase C 704 (e.g., the sinusoidal input), may be provided to an input of an operational amplifier 714. The other input of each of the operational amplifiers 710, 712, and 714 may be provided from a set of amplifier outputs 720 of the microprocessor 500. The respective output 730, 732, 734 of each of the operational amplifiers 710, 712, 714 is provided to a corresponding resistance circuit 740, 742, 744. Preferably each of the respective output 730, 732, 734 are simultaneously provided, thus one for each phase of the circuit. Additional operational amplifiers may likewise be provided for additional circuits, single phase, two phase, and three phase circuits, as desired. In addition "phase A", "phase B", "phase C" may be used by the microprocessor to reduce aliasing.

Figure 14:
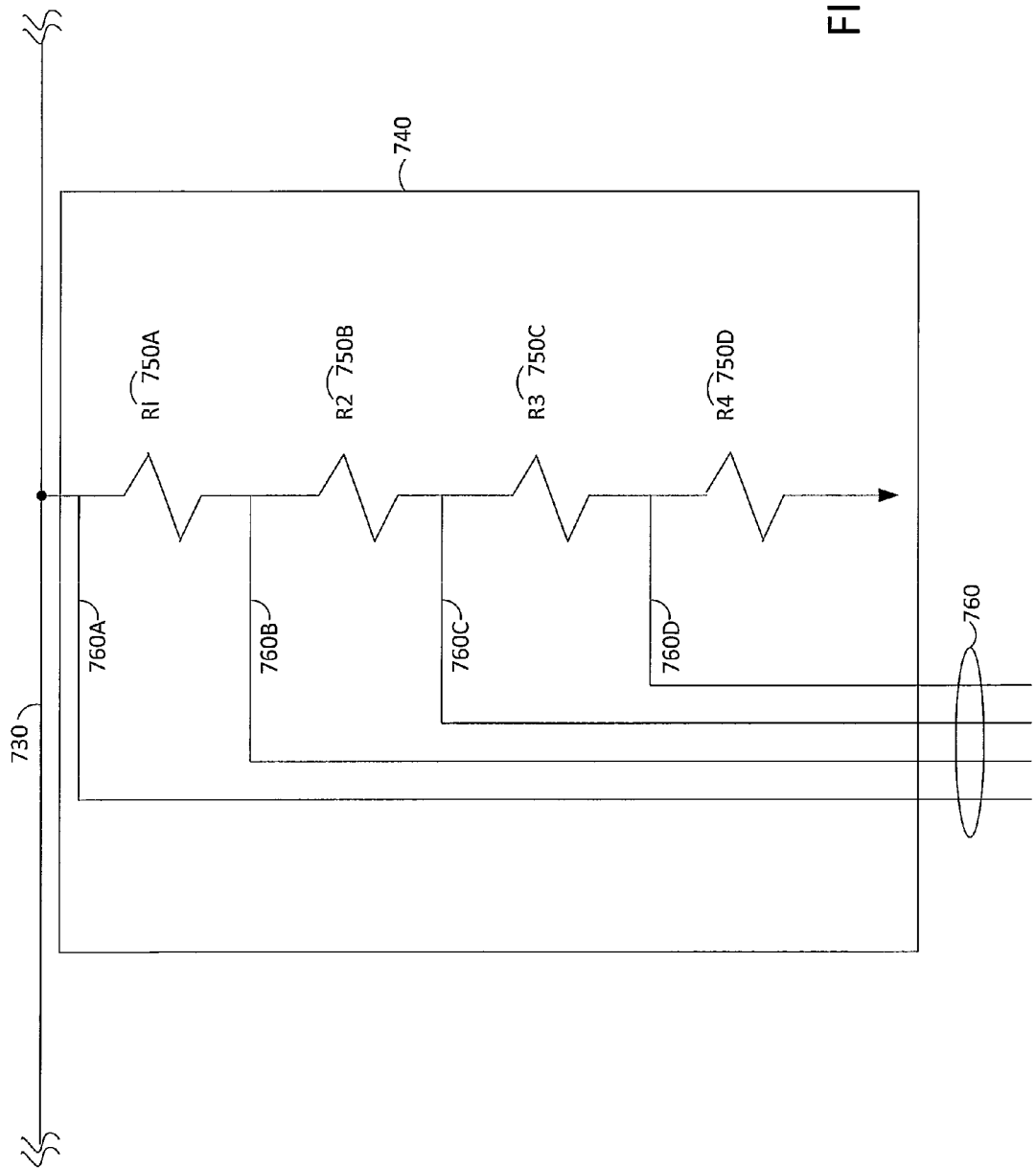
FIG. 14 illustrates a resistance circuit.

Referring also to FIG. 14, each of the resistance circuits 740, 742, 744 may include a set of respective resistors R1 750A, R2 750B, R3 750C, and R4 750D. The respective resistors may be selected to provide desired output gains 750A-D, 752A-D, 754A-D. For example, connector 760A may have a unity gain (e.g., 1). For example, connector 760B may have a gain of 12 times. For example, connector 760C may have a gain of 60 times. For example, connector 760D may have a gain of 20 times. In this manner, the system may have a plurality of simultaneously available different gains 760 for each of the different phases for a particular load. Therefore, the processor 500 may select among the available signals in a manner such that a suitable gain is available for processing. In addition, over time as the magnitude of the output 730 changes a different scaling may be used. Other resistance circuits (including alternative or other elements) may likewise be used, as desired.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A power monitoring system comprising:
   (a) a plurality of current sensors suitable to sense respective changing electrical current within a respective conductor to at least one load;
   (b) at least one conductor sensing a respective voltage potential provided to said at least one load;
   (c) a power monitor that determines a power of said at least one load based upon a signal from at least one of said current sensors and a signal from at least one said conductor;
   (d) said power monitor receiving at a single input to a microprocessor a signal including data simultaneously representative of at least one of (i) a signal from a first one of said current sensors and a second one of said current sensors, and (ii) a signal from a first one of said at least one conductor and a signal from a second one of said at least one conductor;
   (e) said power monitor determining at least one of (i) a frequency of at least one of said signals from said current sensors, (ii) a frequency of at least one of said signals from said conductors, (iii) a phase relationship between at least two of said signals from said current sensors, (ii) a phase relationship between at least two signals from said conductors.

2. The power monitoring system of claim 1 wherein said power monitor determining said frequency of said at least one of said signals from said current sensors.

3. The power monitoring system of claim 1 wherein said power monitor determining said frequency of said at least one of said signals from said conductors.

4. The power monitoring system of claim 1 wherein said power monitor determining said phase relationship between said at least two of said signals from said current sensors.

5. The power monitoring system of claim 1 wherein said power monitor determining said phase relationship between said at least two signals from said conductors.

6. The power monitoring system of claim 1 wherein said power monitor said determines said power for a three phase said load, wherein said power monitor has no more than three said current sensors.

7. The power monitoring system of claim 1 wherein said power monitor said determines said power for a pair of single phase loads, wherein said power monitor has no more than three said current sensors.

8. The power monitoring system of claim 1 wherein said power monitor said determines said power for a single phase load and a two phase load, wherein said power monitor has no more than three said current sensors.

9. The power monitoring system of claim 4 wherein said power monitor determining said phase relationship between said at least two signals from said conductors.

10. The power monitoring system of claim 4 wherein said power monitor said determines said power for a three phase said load, wherein said power monitor has no more than three said current sensors.

11. The power monitoring system of claim 4 wherein said power monitor said determines said power for a pair of single phase loads, wherein said power monitor has no more than three said current sensors.

12. The power monitoring system of claim 4 wherein said power monitor said determines said power for a single phase load and a two phase load, wherein said power monitor has no more than three said current sensors.

13. The power monitoring system of claim 2 wherein said power monitor determining said phase relationship between said at least two signals from said conductors.

14. The power monitoring system of claim 2 wherein said power monitor said determines said power for a three phase said load, wherein said power monitor has no more than three said current sensors.

15. The power monitoring system of claim 2 wherein said power monitor said determines said power for a pair of single phase loads, wherein said power monitor has no more than three said current sensors.

16. The power monitoring system of claim 2 wherein said power monitor said determines said power for a single phase load and a two phase load, wherein said power monitor has no more than three said current sensors.

17. The power monitoring system of claim 1 wherein said signal to said single input to said microprocessor is a series of rectangular pulses.

18. The power monitoring system of claim 1 wherein said signal to said single input to said microprocessor is a series of alternating signals.

19. The power monitoring system of claim 1 wherein said power monitor determines said power for said at least one load based upon said signal from at least one of said current sensors provided to said microprocessor and said signal from at least one said conductor provided to said microprocessor, wherein said signal from said at least one of said current sensors is simultaneously provided to multiple inputs of said microprocessor with multiple different gains.

20. A power monitoring system comprising:
    (a) a plurality of current sensors suitable to sense respective changing electrical current within a respective conductor to at least one load;
    (b) at least one conductor sensing a respective voltage potential provided to said at least one load;
    (c) a power monitor that determines a power of said at least one load based upon a signal from at least one of said current sensors and a signal from at least one said conductor;
    (d) said power monitor determines said power for said at least one load based upon said signal from at least one of said current sensors provided to a microprocessor and said signal from at least one said conductor provided to said microprocessor, wherein said signal from said at least one of said current sensors is simultaneously provided to multiple inputs of said microprocessor with multiple different gains.

* * * * *